United States Patent [19]

Hughes

[11] 3,727,146

[45] Apr. 10, 1973

[54] LINEAR, VOLTAGE VARIABLE, TEMPERATURE STABLE GAIN CONTROL

[75] Inventor: Richard Smith Hughes, Ridgecrest, Calif.

[73] Assignee: The United States of America as represented by the Secretary of the Navy

[22] Filed: Dec. 20, 1971

[21] Appl. No.: 209,843

[52] U.S. Cl. ....................................330/29, 330/30 D

[51] Int. Cl. ..............................................H03g 3/30

[58] Field of Search..........................330/23, 29, 309, 330/69

[56] References Cited

UNITED STATES PATENTS

| | | | |
|---|---|---|---|
| 3,533,005 | 10/1970 | Alm | 330/29 |
| 3,582,807 | 6/1971 | Addis | 330/29 X |
| 3,141,137 | 7/1964 | Gruetman | 330/29 |

*Primary Examiner*—Roy Lake
*Assistant Examiner*—James B. Mullins
*Attorney*—R. S. Sciascia et al.

[57] ABSTRACT

An electronic gain control circuit having first and second differential amplifiers and an operational amplifier wherein the first differential amplifier is coupled to the input and provides the controlled output, the second differential amplifier is coupled to the first differential amplifier and controls the gain of the circuit, and the operational amplifier is coupled to the second differential amplifier for temperature stability and linearity.

3 Claims, 3 Drawing Figures

PATENTED APR 10 1973 3,727,146

LINEAR, VOLTAGE VARIABLE, TEMPERATURE STABLE GAIN CONTROL

BACKGROUND OF THE INVENTION

The present invention relates to the field of gain control circuits. Amplifiers which electronically control their own gain are essential in almost all communication receivers, such as radar receivers. Although there are many prior devices which electronically control the gain of an amplifier, such as forward resistance, saturation resistance, channel resistance, photocell resistance, and transconductance devices, all except one suffer from nonlinear gain change, temperature drift, and low range signal handling capabilities. The exception is the photocell resistance device which has disadvantages of its own, e.g., it requires relatively high power to drive the lamp and the cell must be shielded from ambient light.

The present invention overcomes the disadvantages of the prior devices by utilizing the unique current-division property of the basic differential amplifier to provide a linear, temperature-stable, variable-gain amplifier which has a good control range, control/output isolation, and large signal handling capabilities.

SUMMARY OF THE INVENTION

The present invention is an automatic, electronic gain control having first and second differential amplifiers and an operational amplifier wherein, over a large dynamic range, the gain is not dependent on the signal amplitude. The first differential amplifier is coupled to the input and provides a controlled output, the second differential amplifier is coupled to the first differential amplifier and controls the gain of the circuit, and the operational amplifier is coupled to the second differential amplifier for temperature stability and linearity. The invention utilizes the current division characteristics of the differential amplifier to accomplish gain control by coupling the base of section B of the first differential amplifier directly to the base of section A of the second differential amplifier, a control voltage and the collector voltage of section B of the second differential amplifier to the inputs of the operational amplifier, and the output of the operational amplifier to the common connected bases of section B of the first differential amplifier and section A of the second differential amplifier. Thereby, the current division ratio is dependent on the control voltage; and the gains of the differential amplifiers are mutually dependent. As a result, the controlled gain of the invention is linear and temperature stable.

DESCRIPTION OF THE PREFERRED EMBODIMENT

Figure 1:
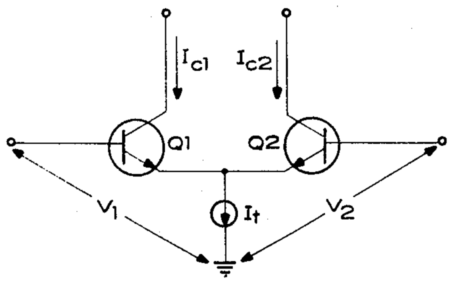
FIG. 1. PRIOR ART
FIG. 1 is a schematic diagram of the basic differential amplifier.

FIG. 1 shows the basic differential amplifier which is well known and used extensively in the field of electronics. The equations for the collector currents of the basic differential amplifier, assuming $Q_1 \cong Q_2$ and $\alpha = 1$, are $$I_{c1} = I_t/[1 + \exp(m\Delta V)], \text{ and} \qquad (1)$$

$$I_{c2} = I_t/[1 + \exp(-m\Delta V)], \qquad (2)$$

where $\Delta V = (V_2 - V_1)$, $m = q/KT$, $K$ is Boltzmann's Constant, $q$ is the electron charge, and $T$ is the temperature in degrees Kelvin. Since $I_t$ is a constant, and $$(I_{c1} + I_{c2}) = I_t, \qquad (3)$$

any decrease in $I_{c1}$ corresponds to a like increase in $I_{c2}$.

Dividing $I_{c1}$ by $I_t$, the Current Division Ratio ($CDR$) is obtained:

$$I_{c1}/I_t = 1/[1 + \exp(m\Delta V)] = CDR \qquad (4)$$

Expanding Equation 2, $$I_{c2} = I_t \exp(m\Delta V)/1 + exp(m\Delta V). \qquad (5)$$

Rearranging Equation 4, $$\exp(m\Delta V) = [1 - CDR]/CDR \qquad (6)$$

Substituting Equation 6 into Equation 5, $$I_{c2}/I_t = 1 - CDR \qquad (7)$$

Figure 2:
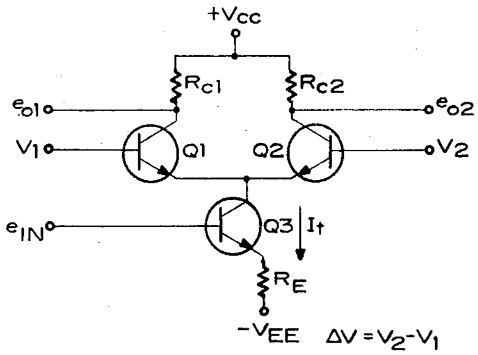
FIG. 2. PRIOR ART
FIG. 2 is a schematic diagram of the basic, variable gain, differential amplifier.

The current source may be obtained with a common emitter transistor as shown in FIG. 2. If the input signal drives the common transistor $Q_3$, then $$I_t = E_{in}/R_e, \qquad (8)$$

where $I_t$ is the current through $Q_3$ due to the input signal. The current $I_t$ will divide between $Q_1$ and $Q_2$.

The circuit gain for FIG. 2 (assuming $\alpha_1 = \alpha_2 = \alpha_3 = 1$) may be expressed as $$E_{01} = -I_{c1}R_{c1}. \qquad (9)$$

From Equation 4 and the relationship $$E_{in} = I_t R_e, \qquad (10)$$

$$E_{01} = -CDR\,(R_{c1}/R_e)E_{in}. \qquad (11)$$

The gain, $A_{V1}$, is given by $$A_{V1} = -CDR\,(R_{c1}/R_e). \qquad (12)$$

Using the same procedure, the gain for $E_{01}$ may be found as $$A_{V2} = -R_{C1}/R_e\,(1 - CDR). \qquad (13)$$

Thus the gain for the amplifier of FIG. 2 is dependent on $R_{C1}$, $R_e$, $CDR$ and not upon the input signal being amplified.

Figure 3:
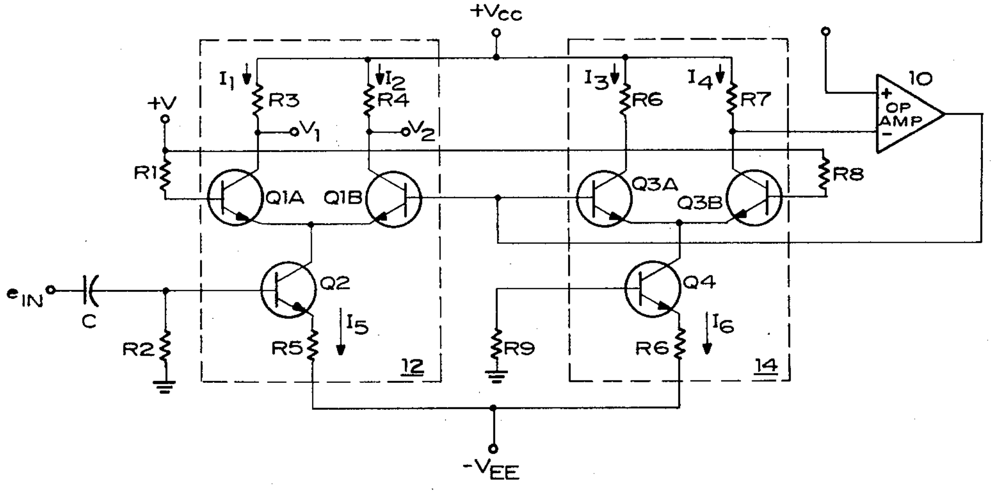
FIG. 3 is a schematic diagram of the present invention.

A linear gain change characteristic can be obtained by making $I_{C1}$ or $I_{C2}$ a linear function of $\Delta V$. This, and inherent temperature stability, can be obtained with the present invention, shown in FIG. 3. Transistors $Q_1$, $Q_2$, $Q_3$ and $Q_4$ may be matched integrated differential amplifiers, such as RCA CA 3026. The operational amplifier drives the base of $Q_{3A}$ so that the collector voltage of $Q_{3B}$ equals $V_C$.

Thus $I_4 = (V_{CC} - V_C)/R_7 = \Delta V_C/R_7$, (14)

and the collector current is a linear function of the control voltage. Since the current division ratio is dependent only on $\Delta V$ (Equation 4), $$CDR = I_4/I_6. \quad (15)$$

Now substituting $I_6 \cong V_{EE}/R_{10}$ and Equation 14 into Equation 15, we get $$CDR = \Delta V_C R_{10}/R_7 V_{EE}. \quad (16)$$

Since the CDR of $Q_1$, $Q_2$ and $Q_3$, $Q_4$ are equal, the current division of the gain stage ($Q_{1A}$, $Q_{1B}$ and $Q_2$) is a linear function of the control voltage $V_C$. Substituting Equation 16 into the gain equations 12 and 13, the gain is shown to be a linear function of the control voltage $\Delta V_C$:

$$A_{V1} = -(R_3/R_5)(R_{10}\Delta V_C/R_7 V_{EE}), \quad (17)$$

$$A_{V2} = -(R_4/R_5)(1 - R_{10}\Delta V_C/R_7 V_{EE}). \quad (18)$$

If we let $R_3$ equal $R_4$ and add Equation 17 and Equation 18, we find that $$A_{V1} - A_{V2} = R_3/R_5. \quad (19)$$

Equation 19 indicates that, as $A_{V1}$ increases, $A_{V2}$ decreases by the same amount. Excellent temperature stability is obtained since the operational amplifier will make sure that the collector voltage of $Q_{3B}$ equals the control voltage.

The gain-controlling amplifier section ($Q_3$, $Q_4$ and the operation amplifier) is ac-isolated from the gain-controlled amplifier section ($Q_1$ and $Q_2$). Thus the *CDR* (and the gain) is not affected by the input signal, which can be dc.

The dc collector voltages are dependent on the Current Division Ratio. If the control voltage is modulated, this modulation also appears at the ac-isolated from the gain-controlled amplifier, $V_{C1A} = V_{C3A}$. If the outputs of $Q_{1B}$ and $Q_{3A}$ are used to drive a differential amplifier with gain $A_{cm}$, the common-mode dc voltage may be subtracted out.

The present invention operates as follows: The operator selects control voltage $V_C$ which is coupled to the operational amplifier wherein it is compared with the collector voltage of transistor $Q_{3B}$. The difference output of the operational amplifier is coupled to the common connected bases of transistors $Q_{1B}$ and $Q_{3A}$. The operational amplifier provides an output in response to the difference between the control voltage $V_C$ and the collector voltage of transistor $Q_{3B}$. That is, when the collector voltage of transistor $Q_{3B}$ equals the control voltage $V_C$ the output of the operational amplifier is discontinued and the bases of transistors $Q_{1B}$ and $Q_{3A}$ are no longer driven. As a result, current $I_4$ is given by Equation 14 and controlled by control voltage $V_C$, the only variable in the equation.

Therefore, since differential amplifiers 12 and 14 have inherent and equal current division ratios and are coupled together, and one of the currents ($I_4$) is a linear function of the control voltage $V_C$, the current division, and thereby the gain, of the gain stage (differential amplifier 12) is a linear function of the control voltage $V_C$.

The design of a complete amplifier becomes a relatively straightforward matter. Only two steps are required: first, determine the maximum gain ($\Delta V_C = 0$) and then determine the gain slope ($dA_V/d\Delta V_C$). Both can be determined theoretically from the gain equation (Equation 18).

$$A_v(\max) = R_4/R_5 \quad (20)$$

$$dA_v/d\Delta V_c = R_4/R_5\,(R_{10}/R_7 V_{EE}) \quad (21)$$

If a common-mode rejection amplifier is used on the output, its gain $A_{cm}$, multiplies Equation 20 and Equation 21.

What is claimed is:

1. An electronic device for automatically controlling gain, comprising:
   - an input;
   - a first differential amplifier coupled to said input for providing the gain controlled output of said device; and
   - gain controlling means coupled to said first differential amplifier for controlling the gain of said device and causing the output of said device to be linear and temperature stable, including
     - an operational amplifier providing an output descriptive of the difference between the instantaneous gain and the preselected gain of the device,
     - a control voltage coupled to one input of said operational amplifier,
     - a second differential amplifier having at least one transistor, and
     - means for coupling the voltage on the collector of one of said transistors to another input of said operational amplifier.

2. The device of claim 1 wherein:
   - said first and second differential amplifiers are transistor circuits; and
   - the base of the second transistor of said first differential amplifier is direct coupled to the base of the first transistor of said second differential amplifier.

3. The device of claim 2 wherein the collector of the second transistor of said second differential amplifier is coupled to another input of said operational amplifier and the output of said operational amplifier is coupled to said direct coupled bases, such that the operational amplifier provides a signal to the direct coupled bases in response to the difference between the control voltage and the collector voltage of the second transistor of the second differential amplifier.

* * * * *